(12) United States Patent
Ghosh (10) Patent No.: US 11,341,287 B2
(45) Date of Patent: May 24, 2022

(54) SYSTEMS AND METHODS FOR GENERATING PHYSICAL PAYMENT CARDS

(71) Applicant: MasterCard International Incorporated, Purchase, NY (US)

(72) Inventor: Debashis Ghosh, Charlotte, NC (US)

(73) Assignee: MASTERCARD INTERNATIONAL INCORPORATED, Purchase, NY (US)

( * ) Notice: Subject to any disclaimer, the term of this patent is extended or adjusted under 35 U.S.C. 154(b) by 1226 days.

(21) Appl. No.: 14/032,910

(22) Filed: Sep. 20, 2013

(65) Prior Publication Data

US 2015/0088290 A1    Mar. 26, 2015

(51) Int. Cl.
| | |
|---|---|
| *G06F 30/00* | (2020.01) |
| *B33Y 50/00* | (2015.01) |
| *B33Y 80/00* | (2015.01) |
| *B29C 64/112* | (2017.01) |

(52) U.S. Cl.
CPC .............. *G06F 30/00* (2020.01); *B33Y 50/00* (2014.12); *B33Y 80/00* (2014.12); *B29C 64/112* (2017.08)

(58) Field of Classification Search
None
See application file for complete search history.

(56) References Cited

U.S. PATENT DOCUMENTS

| | | | |
|---|---|---|---|
| 6,243,687 B1 | 6/2001 | Powell | |
| 6,877,657 B2 | 4/2005 | Ranard et al. | |
| 7,681,789 B2 | 3/2010 | Zellner et al. | |
| 7,806,338 B1 | 10/2010 | Behner et al. | |
| 8,042,732 B2 | 10/2011 | Blake et al. | |
| 8,056,816 B2 | 11/2011 | Behner et al. | |
| 8,079,513 B2 | 12/2011 | Zellner et al. | |
| 8,292,167 B2 | 10/2012 | Behner et al. | |
| 2006/0259189 A1 | 11/2006 | Perlow et al. | |
| 2007/0075134 A1 | 4/2007 | Perlow et al. | |
| 2007/0215699 A1 | 9/2007 | Arego et al. | |
| 2007/0272743 A1 | 11/2007 | Christie et al. | |
| 2008/0015947 A1* | 1/2008 | Swift | G06Q 30/00 705/26.1 |
| 2008/0219738 A1* | 9/2008 | Zellner | G06Q 20/105 400/76 |
| 2010/0239871 A1 | 9/2010 | Scheffer et al. | |
| 2010/0276495 A1 | 11/2010 | Goldstein et al. | |
| 2011/0088931 A1 | 4/2011 | Lettow et al. | |
| 2012/0061478 A1 | 3/2012 | Zellner et al. | |
| 2012/0067950 A1 | 3/2012 | Blake et al. | |

* cited by examiner

*Primary Examiner* — Mohammad Ali
*Assistant Examiner* — Saad M Kabir
(74) *Attorney, Agent, or Firm* — Armstrong Teasdale LLP (57) ABSTRACT

A computer-based method for generating a physical payment card for a consumer is implemented using a computer device including a processor. The method includes identifying a consumer account and creating, by the processor, a model data file associated with the physical payment card for the consumer account. The model data file includes data representing the physical payment card. The method includes transmitting the model data file to a 3-dimensional printer device and the model data file is configured to enable the printer device to print the physical payment card.

21 Claims, 8 Drawing Sheets

300
Example computer system used for issuing payment cards

SYSTEMS AND METHODS FOR GENERATING PHYSICAL PAYMENT CARDS

BACKGROUND OF THE DISCLOSURE

The field of the disclosure relates generally to the fabrication of consumer payment cards and more particularly to systems and methods for enabling consumers to fabricate their own payment cards (i.e., "self-generation") using 3-Dimensional ("3D") printing, wherein the payment cards can be used by the consumer to initiate payments.

3D printing, also referred to as "additive manufacturing," is a process for fabricating physical (i.e., 3-dimensional) objects. 3D printing emerged as a new technology in the 1980's and has progressed to a point where a consumer can purchase a 3D printer for home use at an affordable price. Some known 3D printers use liquid or powder material to lay down successive layers of an object such that the object is created, or "printed," one layer at a time. These printers work using a design file of the 3D object. The design file, in some known formats, represents a 3-dimensional view of the object to be printed (i.e., similar to a CAD design), which may then be converted to instructions used by the 3D printer to create the object. In other embodiments, the design file includes instructions for creating the object (e.g., instructions converted from a CAD design).

In some known payment card fabrication processes, plastic card bodies are manufactured in large quantities by a manufacturer. These card bodies may include laminated surfaces that display, for example, an issuing bank's logo. The card bodies may also include a magnetic strip or microprocessor ("microchip") for storing identification information. After manufacture, these card bodies are later customized for use by an individual consumer. Such customization may include, for example, embossing an account number and the consumer's name onto the card (i.e., to create the raised numbers and letters commonly seen on credit cards and other payment cards), and configuring the magnetic strip or the microchip with data associating the card with the consumer's account. However, the process of manufacturing, customizing, and issuing payment cards costs issuing banks a significant amount per card issued. A more efficient way to manufacture and customize payment cards is needed.

BRIEF DESCRIPTION OF THE DISCLOSURE

In one aspect, a computer-based method for generating a physical payment card for a consumer is provided. The method is implemented using a computer device including a processor. The method includes identifying a consumer account. The method also includes creating, by the processor, a model data file associated with the physical payment card for the consumer account. The model data file includes data representing the physical payment card. The method further includes transmitting the model data file directly or indirectly to a 3-dimensional printer device. The model data file is configured to enable the printer device to print the physical payment card.

In another aspect, a computing device for generating a physical payment card for a consumer is provided. The computer device includes a processor communicatively coupled to a memory. The computing device is programmed to identify a consumer account. The computing device is also programmed to create a model data file associated with the physical payment card for the consumer account. The model data file includes data representing the physical payment card. The computing device is further programmed to transmit the model data file directly or indirectly to a 3-dimensional printer device. The model data file is configured to enable the printer device to print the physical payment card.

In yet another aspect, a computer-based method for generating a physical payment card for a consumer is provided. The method is implemented using a computer device in communication with a 3-dimensional printer. The method includes receiving, by the computer device, a model data file including 3-dimensional printing definition data for printing the physical payment card. The printing definition data includes card body data representing a card body of the physical payment card. The method also includes printing the payment card using at least the computing device, the 3-dimensional printer, and the model data file, thereby generating a physical payment card including at least a card body.

In still another aspect, a computer system for generating a physical payment card for a consumer is provided. The computer system includes at least one processor. The computer system also includes a user interaction device communicatively coupled with said at least one processor. The user interaction device includes a display device and an input device. The user interaction device is configured to identify and authenticate the consumer associated with a consumer account. The computer system further includes a 3-dimensional printer communicatively coupled with said at least one processor. The 3-dimensional printer configured to receive, from the at least one processor after authentication of the consumer, a model data file associated with the physical payment card for the consumer account. The model data file includes data representing the physical payment card. The 3-dimensional printer is also configured to print the physical payment card using at least the model data file and the 3-dimensional printer.

BRIEF DESCRIPTION OF THE DRAWINGS

FIGS. 1-9 illustrate example embodiments of the methods and systems described herein.

DETAILED DESCRIPTION OF THE DISCLOSURE

Embodiments of the present disclosure facilitate self-issuance of payment cards (i.e., financial transactions cards such as credit cards, debit cards, prepaid cards, loyalty cards, rewards cards, etc.) using 3-dimensional (3D) printing. An issuer of payment cards wishes to issue a payment card to its customer (e.g., a consumer). Rather than manufacturing and customizing a physical card for the consumer, the issuer creates a 3D model data file that represents what a customized physical card for that consumer should look like. The model data file, or "image", in some embodiments, has elements typical of payment cards, such as a raised account number and customer name (i.e., simulating the normal embossment process, and allowing the card to function with carbon copy machines), bank and payment network logos appearing on the face of the card, and card security codes printed on the front or back. In some embodiments, the model data file may also define slots or areas in the card body for adding additional elements after printing, such as a section for adhering a magnetic strip or a microchip.

Once the image file for the consumer's payment card is created, the issuer, in some embodiments, may transmit the model data file to the consumer, and the consumer may "print" the card body using their own personal 3D printer. In other embodiments, the issuer may transmit the model data file directly to a system that includes a 3D printer, such as to a kiosk computing device, where the consumer may go to have their card printed.

To enable additional payment card functionality, one or more data-carrying device components, such as a magnetic strip and/or a microchip, may be created for the consumer's card as well. In some embodiments, the issuer configures the data-carrying device and mails the components to the consumer. In other embodiments, components are provided and configured on location with the consumer, such as at a kiosk. After printing of the card body, the components are adhered or otherwise coupled to the card body by the consumer. For example, after a consumer prints the card body using a personal 3D printer, the consumer would then adhere a magnetic strip to the back of the card at an appropriate position (a position perhaps outlined during printing of the card body). Once the components are coupled to the card body, the payment card's physical assembly is complete.

The present disclosure relates to 3D printing, sometimes also called "additive manufacturing." More specifically, the systems and processes described herein include using 3D printing to generate a payment card that is configured to initiate payment transactions within a payment network (sometimes referred to as an interchange network). As used herein, the term "image," "image file," and "3D model data file" are used broadly and interchangeably to refer to a data file that represents a 3-dimensional object such as the body of a credit card and/or enables a 3-dimensional printer to print such an object. In some embodiments, the image file is formatted such that it may be interpreted directly by a 3D printer and used to create the 3D object. In other embodiments, the image file may be in another format, such as a Computer Aided Design (CAD) format, and may need to be converted to a 3D printer file format before a 3D printer can create the 3D object from the file. Some known techniques in the art include 3D printing using multiple materials, printing color onto surfaces, printing magnetic material surfaces that may be charged with customized data, printing electric circuitry such as that found in microchips or magnetic strip replacement technologies, and holographic images or other security measures, any or all of which may be used by the systems and methods described herein.

A technical effect of the systems and processes described herein include at least one of: (a) identifying a consumer account; (b) creating, by a processor, a model data file associated with the physical payment card for the consumer account, wherein the model data file includes data representing the physical payment card; (c) transmitting the model data file directly or indirectly to a 3-dimensional printer device, the model data file is configured to enable the printer device to print the physical payment card; (d) configuring one or more components for coupling to the physical payment card, wherein the one or more components include at least one of a magnetic strip and an identification microchip; (e) creating a model data file defining instructions for printing a receiving surface on the physical payment card to assist coupling of the one or more components to the physical payment card; (f) sending to a third party the one or more physical components; (g) transmitting the model data file to at least one of a consumer and a printing service supplier for printing on the 3-dimensional printer device; (h) creating a model data file including 3-dimensional printing definition data representing the payment card; (i) creating a model data file including one or more of a raised account number and a raised consumer name associated with the consumer account; (j) creating a model data file for the 3-dimensional printer device that uses one or more of extrusion deposition, granular material binding, and stereolithography; (k) creating a model data file including instructions for printing a magnetic strip within the physical payment card; (l) creating a model data file including instructions for printing a microchip within the physical payment card; (m) receiving a model data file including 3-dimensional printing definition data for printing the physical payment card, wherein the printing definition data includes card body data representing a card body of the physical payment card; (n) printing the payment card using at least the computing device, the 3-dimensional printer, and the model data file, thereby generating a physical payment card including at least a card body; (o) receiving, by a third party associated with the computer device, one or more components for coupling to the card body, wherein the one or more components include at least one of a magnetic strip and an identification microchip for use with the payment card, wherein the component data includes instructions for printing a receiving surface within the card body to assist coupling of the one or more components to the card body; (p) coupling the one or more components to the card body; (q) printing one or more components, wherein the one or more components include at least one of a magnetic strip and an identification microchip for use with the payment card, wherein the component data includes instructions for printing the one or more components integral with the card body; (r) printing the payment card with a 3-dimensional printer using one or more of extrusion deposition, granular material binding, and stereolithography; (s) receiving a model data file defining instructions for printing the payment card including payment card account information associated with the consumer; and (t) receiving a model data file defining instructions for printing identifying information for an issuing bank associated with the payment card.

In one embodiment, a computer program is provided, and the program is embodied on a computer readable medium, such as a non-transitory computer readable medium. In an example embodiment, the system is executed on a single computer system, without requiring a connection to a sever computer. In a further example embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

The following detailed description illustrates embodiments of the disclosure by way of example and not by way of limitation. It is contemplated that the disclosure has general application to processing financial transaction data by a third party in industrial, commercial, and residential applications.

As used herein, an element or step recited in the singular and proceeded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

Figure 1:
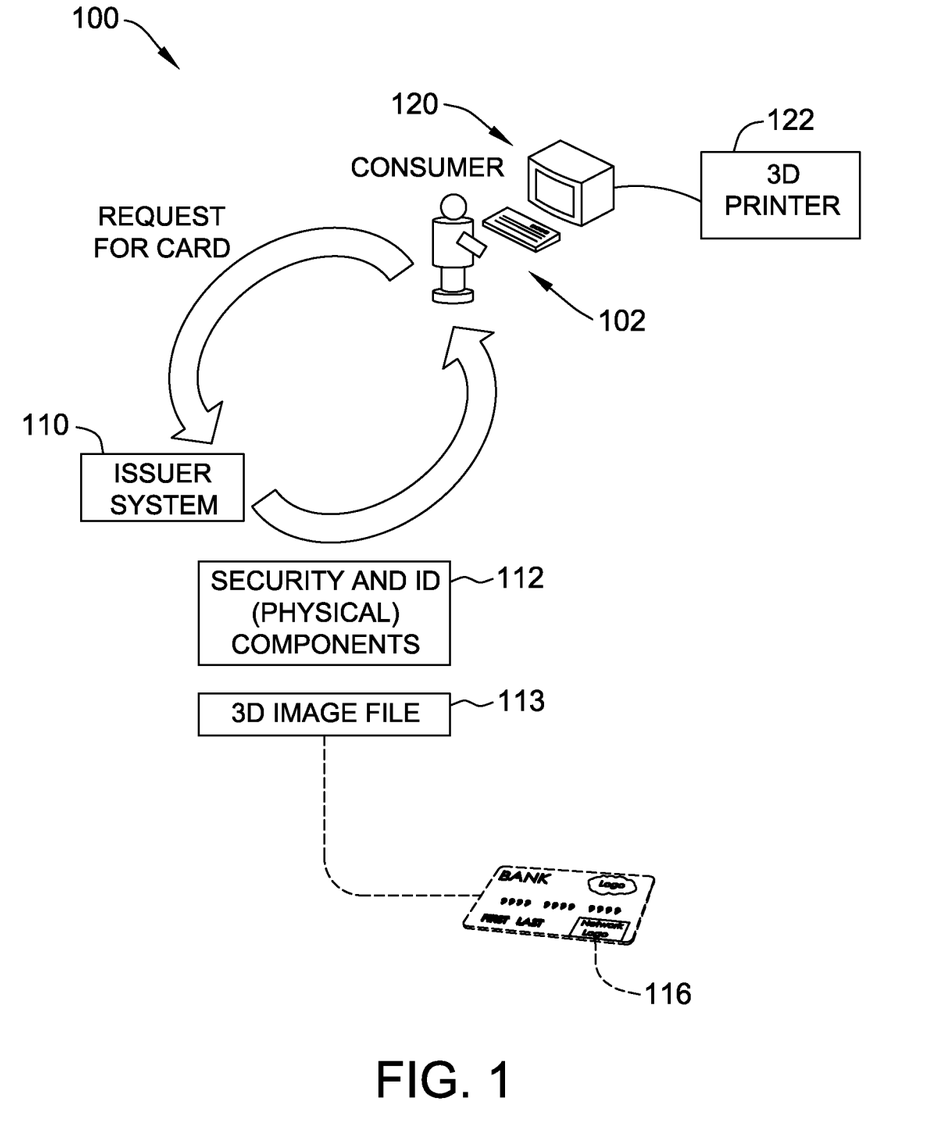
FIG. 1 illustrates an example environment for self-issuance of a payment card to a consumer.

FIG. 1 illustrates an example environment 100 for self-issuance of a payment card 116 to a consumer 102. An issuer system 110 receives a request for creation of a new payment card, such as when consumer 102 creates a new account, or when consumer 102 has an existing account nearing expiration. In some embodiments, a person or entity acting on behalf of consumer 102 may take the place of consumer 102. Issuer system 110 generates a 3D image file 113 that represents a virtual image of consumer's 102 physical payment card 116. Issuer system 110, in some embodiments, also configures physical components that may be coupled to physical payment card 116, such as a magnetic strip and/or microchip. As used herein, the term "issuer" generally refers to a party responsible for providing a payment card to a consumer or cardholder. Accordingly, as used herein, an issuer is defined broadly to include any party involved in the process, such as an issuing bank (i.e., the bank that establishes and maintains the payment account for the consumer), a payment network, a third party service provider associated with the issuing bank, or other parties involved in issuing or creating a payment card provided to a consumer or cardholder, any of which may be involved with creating the 3D image files 113 and/or configuration of other components associated with physical payment card 116.

In some embodiments, image file 113 is emailed or otherwise transmitted and/or transferred to consumer 102 for printing by consumer 102 using a computing device 120 and a 3D printer 122. In other embodiments, image file 113 is electronically transmitted to a third-party computing system (not shown in FIG. 1) for printing and delivery to consumer 102. Further, in some embodiments, physical components 112 are configured by issuer system 110 and mailed to consumer 102 for attachment to physical payment card 116 after printing. In other embodiments, un-configured physical components 112 are configured by a third-party computing system and provided to consumer 102 or coupled to physical payment card 116 after printing, and subsequently provided to consumer 102. In some embodiments, payment card 116 is printed at a kiosk system (not shown in FIG. 1). Kiosk system may be similar to issuer system 110 and/or consumer computing device 120 and 3D printer 122. The kiosk system may appear in, for example, a retail environment frequented by consumers 102, such as a shopping mall or grocery store, or may appear in a third-party place of business, such as a print shop or a bank. Components and operation of the kiosk system are described in greater detail in relation to FIG. 4, below.

In the example embodiment, 3D image file 113 (i.e., the virtual representation of physical payment card 116) is created using one or more of: (a) a logo for an issuing bank; (b) a logo for a payment network; (c) an account number for the consumer's account; (d) the consumer's name to appear on the face of the card; (e) an expiration date associated with the payment card; and (f) a security code associated with the payment card. Further, a look and feel of the physical card may be designed and agreed upon by the payment network and/or the issuing bank, and may include colors and/or designs to appear on the face of the card. Any or all of these elements may be integrated into 3D image file 113 such as to generate a particular look and feel for physical payment card 116.

Figure 2:
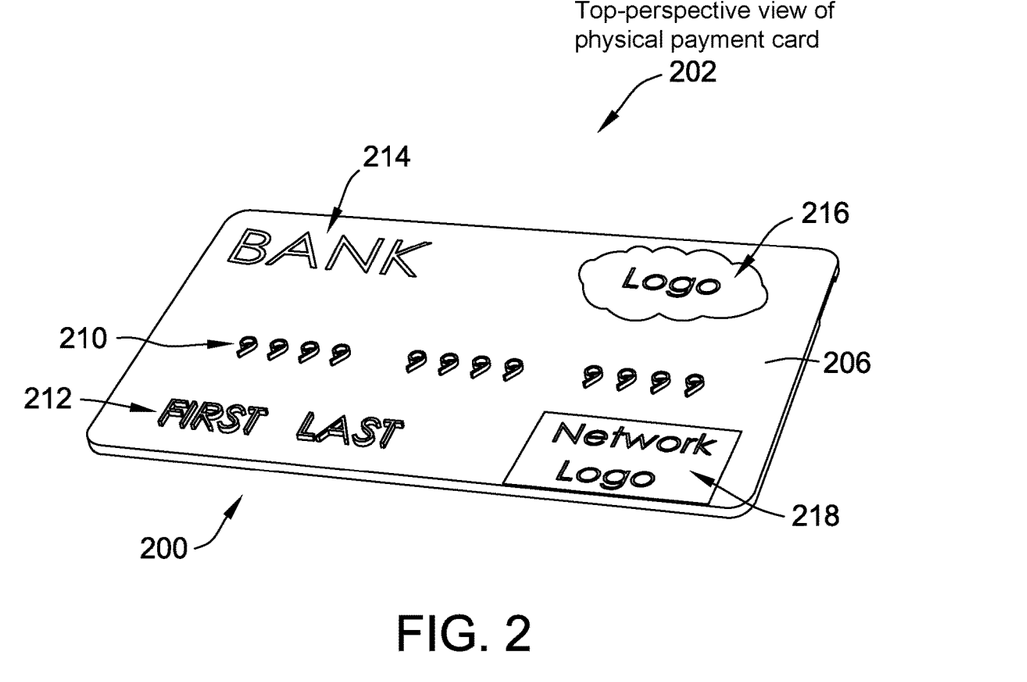
FIG. 2 illustrates a top-perspective view of a physical payment card that may be created using the example environment shown in FIG. 1.
Figure 3:
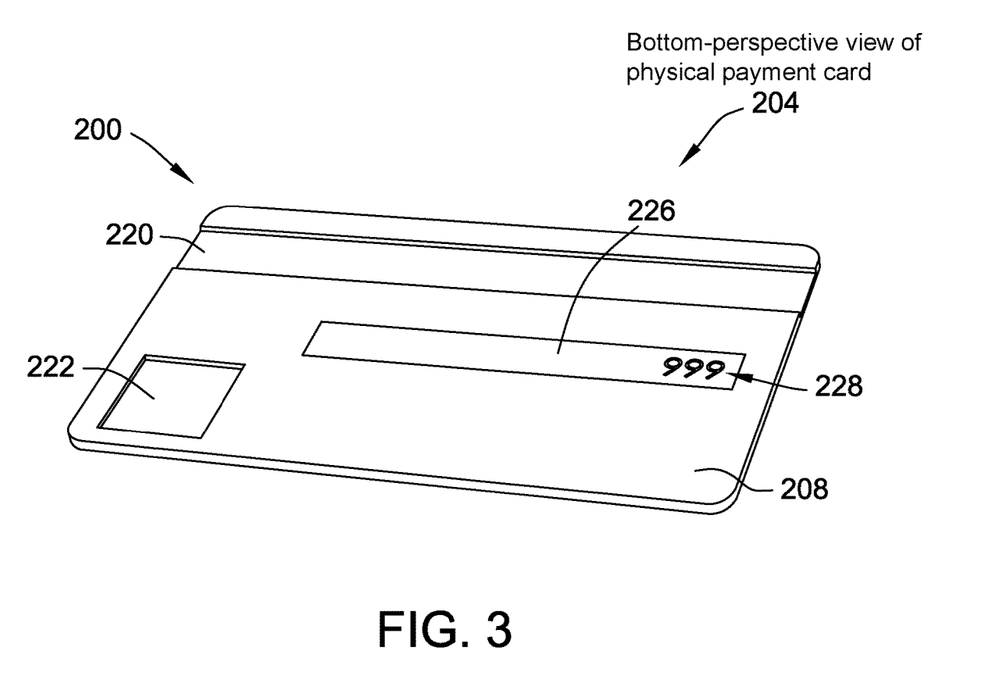
FIG. 3 illustrates a bottom-perspective view of a physical payment card that may be created using the example environment shown in FIG. 1.

FIG. 2 and FIG. 3 illustrate a top-perspective view 202 and a bottom-perspective view 204 of a physical payment card 200 that may be created using the example environment shown in FIG. 1. Payment card 200 may be similar to physical payment card 116 (shown in FIG. 1). In some embodiments, physical payment card 200 includes raised numbers 210 and raised letters 212 on a front surface 206 of physical payment card 200, similar to payment cards created with known embossed methods. Also, in some embodiments, physical payment card 200 includes an issuer name 214, an issuer logo 216, and/or a payment network logo 218. Further, in some embodiments, physical payment card 200 includes card security codes (CSC) 228 such as, for example, Card Verification Values (CVV or CVV2) or Card Verification Codes (CVC or CVC2). Although numbers 210 and letters 212 are illustrated as being raised from the front surface 206, in other embodiments the numbers 210 and letters 212 may be recessed into the front surface 206. Further, in some embodiments, physical payment card 200 includes a signature section 226. In some embodiments, signature section 226 may be printed using material that enhances writing, thereby allowing consumer 102 (shown in FIG. 1) to more easily write his or her signature on physical payment card 200.

In some embodiments, physical payment card 200 may be created having pre-designated areas for coupling physical components 112 (shown in FIG. 1), such as a magnetic strip section 220 and/or a microchip section 222, either or both of which may be recessed with respect to back surface 208. Physical components 112 may be components associated with payment card security (i.e., security components). Magnetic strip section 220, in the example embodiment, includes a small indentation or recess relative to a back surface 208 of physical payment card 200. Magnetic strip section 220 is configured in such a way as to conform to industry standards for the expected position of magnetic strips on payment cards. Further, magnetic strip section 220 is also configured to be of a size and shape similar to a magnetic strip that is to be coupled to the card. In the example embodiment, microchip section 222 is positioned and oriented in any way such as not to interfere with other operational aspects of physical payment card 200.

In other embodiments, physical payment card 200 may be created without physical components 112, but with printed security components that are a part of 3D image file 113. Some 3D printers are capable of printing magnetic materials such that a magnetic strip may be printed as a part of creating physical payment card 200, rather than, or in addition to, coupling after printing. Similarly, some 3D printers are capable of printing electronic circuitry. As such, microchip functionality may be printed into the physical payment card 200 rather than, or in addition to, coupling after printing. It should be understood that, while some of the embodiments described herein include magnetic strips and/or microchips, any other components and/or security components that enable operation of the systems and methods described herein may be used.

Figure 4:
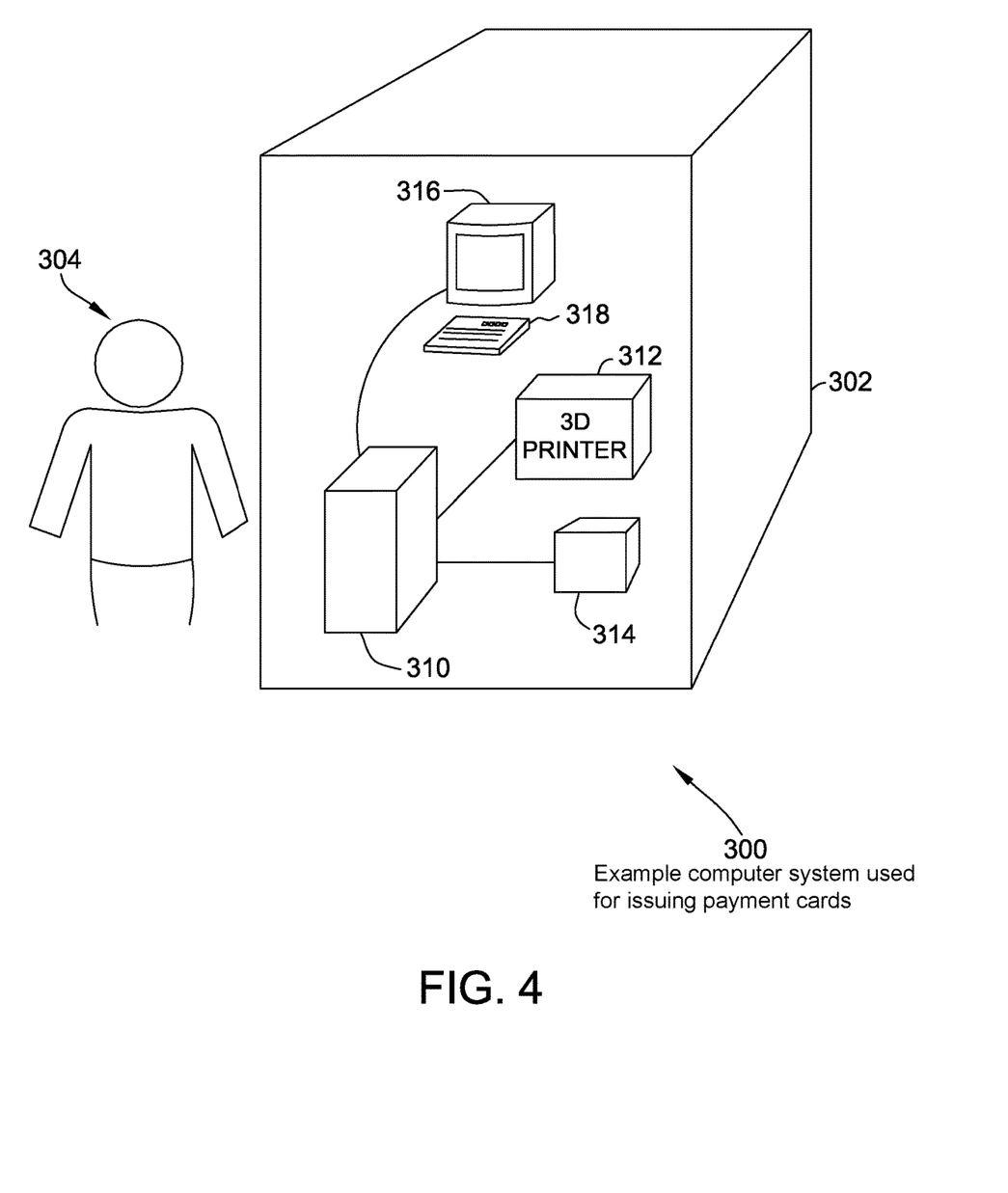
FIG. 4 is an example computer system included within the example environment shown in FIG. 1 and used for issuing payment cards.

FIG. 4 is an example computer system 300 included within the example environment shown in FIG. 1 and used for issuing payment cards. In the example embodiment, computer system 300 includes a computing device 310 having at least a processor communicatively coupled to a 3D printer 312, a display device 316, and an input device 318. In some embodiments, computer system 300 also includes a physical component dispenser 314. Display device 316 and input device 318, in some embodiments, are a conventional keyboard and/or mouse and a computer screen. Alternatively, display device 316 and input device 318 may be any devices that allow a user 304 to interact with the computing device 310 to identify a consumer associated with a payment card and perform other operations associated with the systems and methods described herein.

3D printer 312, in the example embodiment, is a 3-dimensional printer capable of performing an additive manufacture of a payment card body as described herein. Examples of such printing methods include, for example, extrusion deposition, granular material binding, and stereolithography. Alternatively, any such printing method that enables the operation of the systems and methods described herein may be used.

In one embodiment, computer system 300 is configured in a kiosk 302 setting. Kiosk 302 may be deployed, for example, in a shopping mall, a bank, at a third party printing service supplier, or any other appropriate setting. During operation, a user 304 interacts with computer system 300 to create a physical payment card for a consumer. In some embodiments, user 304 may be consumer 102 (shown in FIG. 1). In the example embodiment, user 304 uses display 316 and/or input device 318 to identify a consumer payment card to fabricate. In some embodiments, computing device 310 authenticates user 304 and/or consumer 102 prior to allowing the payment card fabrication to proceed. Authentication may include, for example, verifying that user 304 is the card holding consumer 102, or is otherwise privileged to fabricate a payment card for the cardholder. In some embodiments, system 300 receives 3D image file 113 from a remote system, such as issuer system 110 (shown in FIG. 1). In other embodiments, system 300 generates 3D image file 113 locally using, for example, computing device 310. 3D printer 312 prints a physical payment card body using the model data file.

Further, in some embodiments, physical component dispenser 314 configures a physical component for use with the physical payment card. For example, a magnetic strip and/or a microchip may be separately provided and configured by physical component dispenser 314, which may retain an internal inventory of "blank" or otherwise un-configured components. The physical component is configured with customized data specific to the consumer, the consumer's payment card, and/or the consumer's account.

In the example embodiment, the physical payment card is dispensed to user 304 after fabrication, along with one or more physical components. User 304 may then couple the physical components to the physical payment card to complete assembly. Physical components may be adhered or otherwise coupled to the physical payment card in designated areas, such as magnetic strip section 220 and/or a microchip section 222 (both shown in FIG. 3). In other embodiments, computer system 300 may couple physical components to the physical payment card after fabrication, or may provide the physical components to 3D printer 312 prior to fabrication and which may then be integrated into the physical payment card during fabrication. In still other embodiments, physical components may be printed by 3D printer 312 separately from or integrally with the physical payment card.

Figure 5:
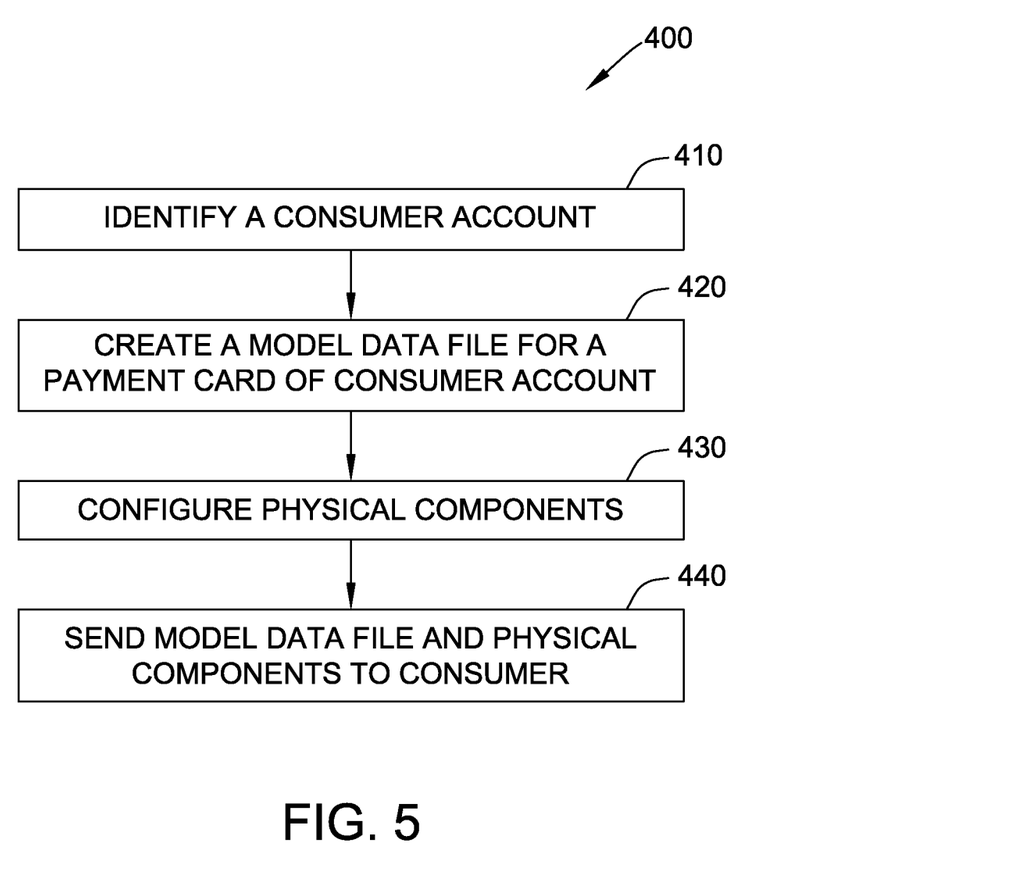
FIG. 5 is an example method for self-source issuance of payment cards using the computer system shown in FIG. 4 from the perspective of an issuer.

FIG. 5 is an example method 400 for self-source issuance of payment cards using computer device 310 (shown in FIG. 4) from the perspective of, for example, an issuer 110 (shown in FIG. 1). A consumer account is identified 410. A model data file is created 420 for a payment card associated with the consumer account. In some embodiments, one or more physical components, such as a magnetic strip and a microchip, are configured 430. The model data file and, optionally, the physical components are then sent 440 to the consumer.

Figure 6:
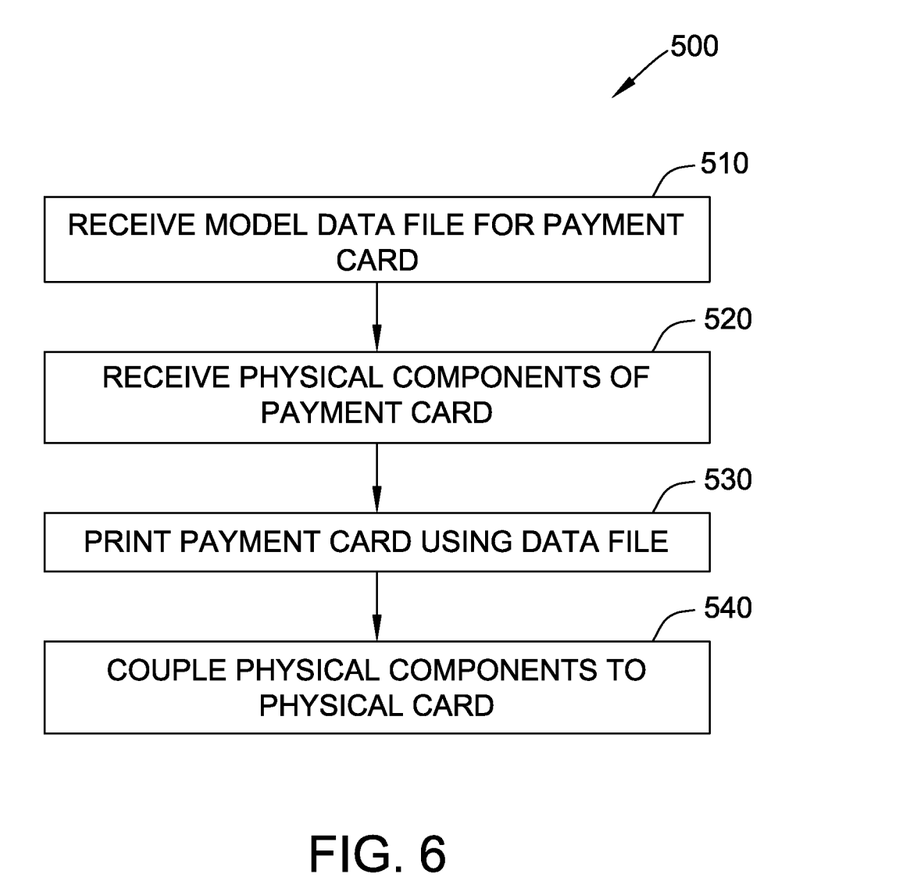
FIG. 6 is an example method for self-source issuance of payment cards using the computer system shown in FIG. 4 from the perspective of a consumer or another third party.

FIG. 6 is an example method 500 for self-source issuance of payment cards using computer device 310 (shown in FIG. 4) from the perspective of, for example, a consumer 102 (shown in FIG. 1) or another third party. In some embodiments, these steps may be performed by another party, such as user 304 (shown in FIG. 4). In the example embodiment, consumer 102 receives 510 a model data file for their payment card, and may additionally receive 520 physical components for the payment card. Consumer 102 prints 530 the physical payment card using a 3-dimensional printer such as 3D printer 122 (shown in FIG. 1) and 3D printer 312 (shown in FIG. 4). Consumer 102 then couples 540 physical components to the physical payment card.

Figure 7:
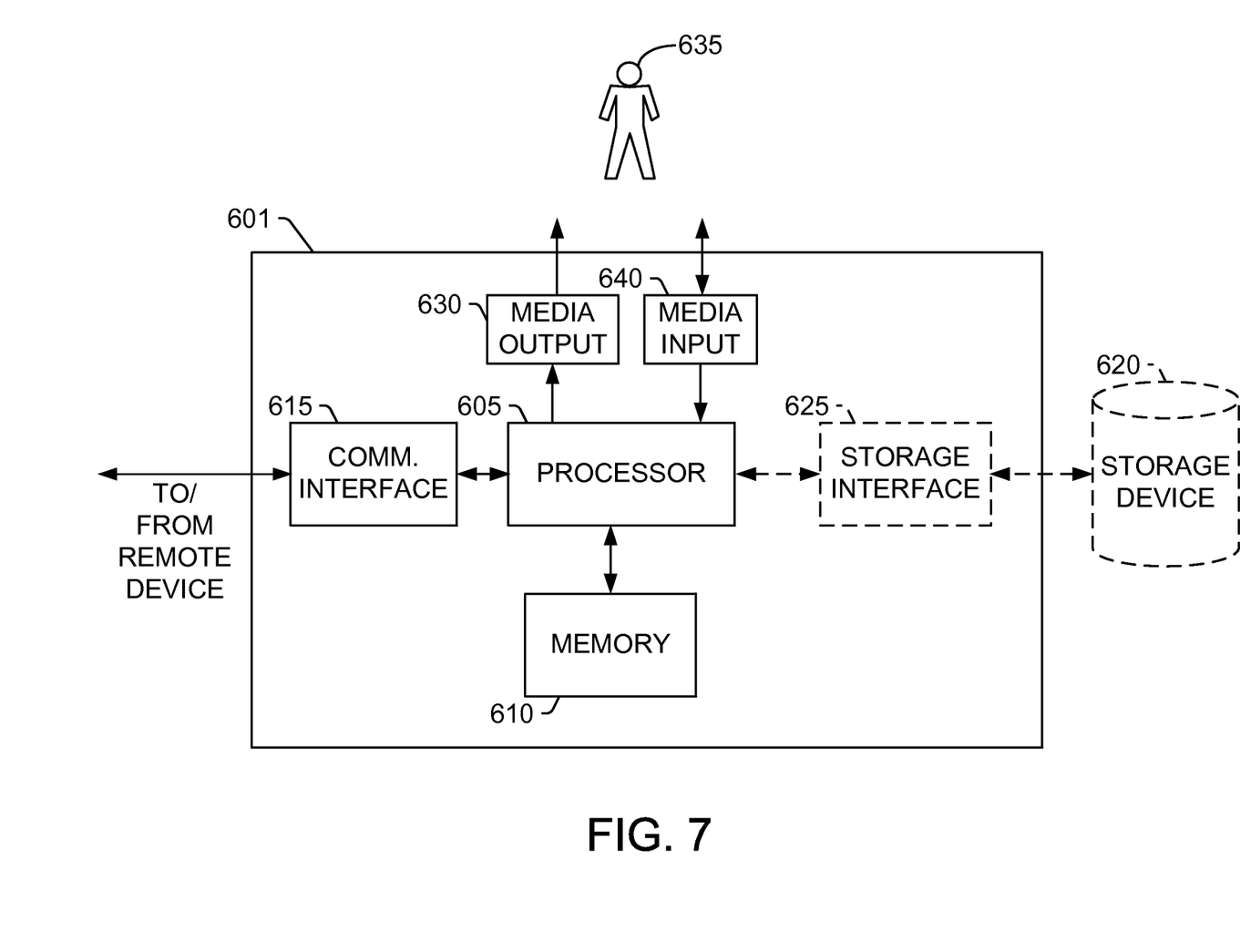
FIG. 7 illustrates an example configuration of a server system that may be used with the environment shown in FIG. 1.

FIG. 7 illustrates an example configuration of a server system 601 that may be used with environment 100 (shown in FIG. 1). Server system 601, in some embodiments, is similar to issuer system 110 and/or computer device 120 (both shown in FIG. 1), and/or computer device 310 (shown in FIG. 4). Server system 601 includes a processor 605 for executing instructions. Instructions may be stored in a memory area 610, for example. Processor 605 may include one or more processing units (e.g., in a multi-core configuration) for executing instructions. The instructions may be executed within a variety of different operating systems on the server system 601, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C#, C++, Java, or other suitable programming languages, etc.).

Processor 605 is operatively coupled to a communication interface 615 such that server system 601 is capable of communicating with a remote device such as a user system or another server system 601. Communication interface 615 may include, for example, a wired or wireless network adapter or a wireless data transceiver for use with a mobile phone network, Global System for Mobile communications (GSM), 3G, or other mobile data network or Worldwide Interoperability for Microwave Access (WIMAX). For example, communication interface 615 may communicatively couple with issuer system 110 (shown in FIG. 1) and/or computing device 120 via the Internet, or any other network.

Processor 605 may also be operatively coupled to a storage device 620. Storage device 620 is any computer-operated hardware suitable for storing and/or retrieving data. In some embodiments, storage device 620 is integrated in server system 601. For example, server system 601 may include one or more hard disk drives as storage device 620. In other embodiments, storage device 620 is external to server system 601 and may be accessed by a plurality of server systems 601. For example, storage device 620 may include multiple storage units such as hard disks or solid state disks in a redundant array of inexpensive disks (RAID) configuration. Storage device 620 may include a storage area network (SAN) and/or a network attached storage (NAS) system.

In some embodiments, processor 605 is operatively coupled to storage device 620 via a storage interface 625. Storage interface 625 is any component capable of providing processor 605 with access to storage device 620. Storage interface 625 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 605 with access to storage device 620.

Server system 601 may also include at least one media output component 630 for presenting information to a user 635. Media output component 630 is any component capable of conveying information to user 635. In some embodiments, media output component 630 includes an output adapter such as a video adapter and/or an audio adapter. An output adapter is operatively coupled to processor 605 and operatively couplable to an output device such as a display device, a liquid crystal display (LCD), organic light emitting diode (OLED) display, or "electronic ink" display, or an audio output device, a speaker or headphones.

In some embodiments, server system 601 includes an input device 640 for receiving input from user 635. Input device 640 may include, for example, a keyboard, a pointing device, a mouse, a stylus, a touch sensitive panel, a touch pad, a touch screen, a gyroscope, an accelerometer, a position detector, or an audio input device. A single component such as a touch screen may function as both an output device of media output component 630 and input device 640.

Memory area 610 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Stored in memory area 610 are, for example, computer readable instructions for providing a user interface to user 635 via media output component 630 and, optionally, receiving and processing input from input device 640. A user interface may include, among other possibilities, a web browser and client application. Web browsers enable users, such as user 635, to display and interact with media and other information typically embedded on a web page or a website from server system 601. A client application allows user 635 to interact with a server application from server system 601.

Figure 8:
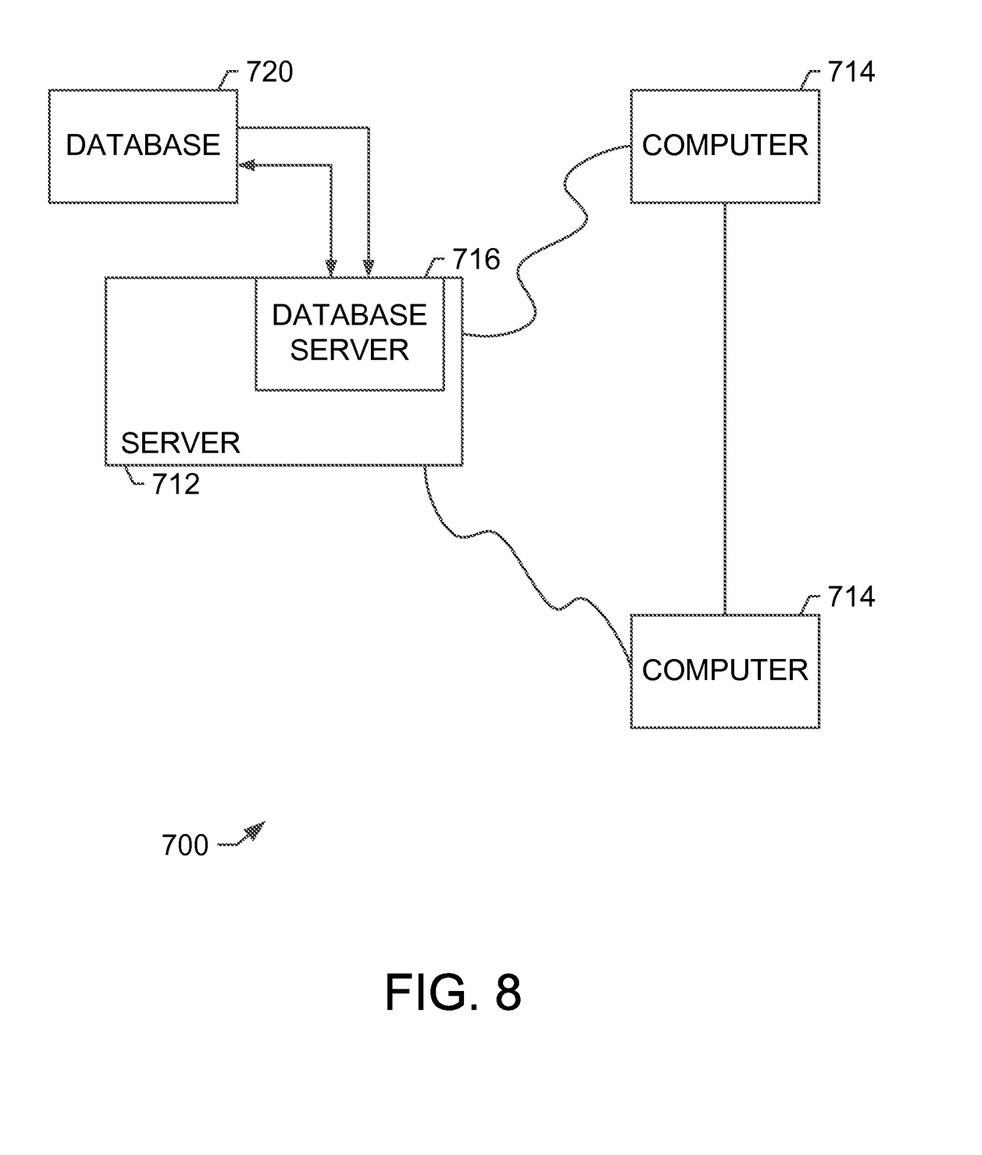
FIG. 8 is a simplified block diagram of an example system for use with environment shown in FIG. 1.

FIG. 8 is a simplified block diagram of an example system 700 for use with environment 100 shown in FIG. 1. System 700, in some embodiments, is similar to issuer system 110 and/or computer device 120 (both shown in FIG. 1), and/or computer device 310 (shown in FIG. 4). More specifically, in the example embodiment, system 700 includes a server system 710, and a plurality of client sub-systems, also referred to as client systems 714, connected to server system 712. System 700 is sometimes referred to as the RPPS® (Remote Payment and Presentment Service) system or the payment system. (RPPS is a registered trademark of MasterCard International Incorporated.) In one embodiment, client systems 714 are computers including a web browser, such that server system 712 is accessible to client systems 714 using the Internet. Client systems 714 are interconnected to the Internet through many interfaces including a network, such as a local area network (LAN) or a wide area network (WAN), dial-in-connections, cable modems and special high-speed ISDN lines. Client systems 714 could be any device capable of interconnecting to the Internet including a web-based phone, personal digital assistant (PDA), or other web-based connectable equipment. A database server 716 is connected to a database 720 containing information on a variety of matters, as described below in greater detail. In one embodiment, centralized database 720 is stored on server system 712 and can be accessed by potential users at one of client systems 714 by logging onto server system 712 through one of client systems 714. In an alternative embodiment, database 720 is stored remotely from server system 712 and may be non-centralized.

3D printing model data files and/or other consumer payment account related data can be stored within database 720. For example, consumer account numbers and names, security codes, and other information and images associated with fabricating payment cards can be stored within database 720.

Figure 9:
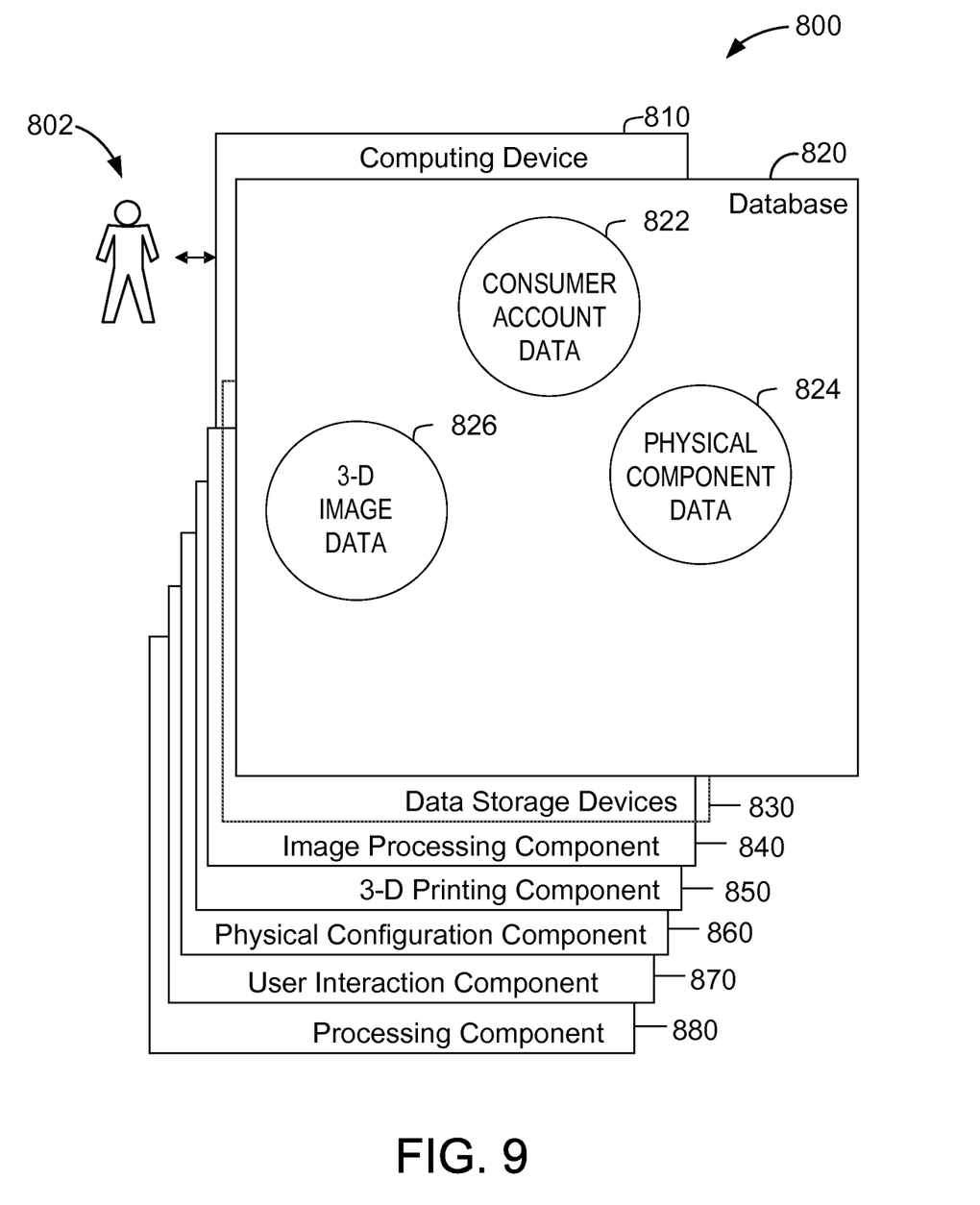
FIG. 9 illustrates an example configuration of a database within a computing device, along with other related computing components, that may be used during the fabrication process.

FIG. 9 illustrates an example configuration 800 of a database 820 within a computing device 810, along with other related computing components, that may be used during the fabrication process. Database 820 is coupled to several separate components within computing device 810, which perform specific tasks. In the example embodiment, computing device 810 could be computing device 120 (shown in FIG. 1), computing device 310 (shown in FIG. 4), and/or server system 712 (shown in FIG. 7).

In the example embodiment, database 820 includes consumer account data 822, physical component data 824, and 3D image data 826. Consumer account data 822 includes information associated with consumers, such as consumer 102 (shown in FIG. 1), and information associated with consumers' accounts, such as, for example, consumer address, consumer account number, and consumer name. In some embodiments, physical component data 824 may include data associated with configuring physical components, such as microchip circuitry information and/or information that may be stored on magnetic strips. 3D image data 826 includes information associated with 3D model data images as described above. In some embodiments, 3D image data 826 includes template graphics and logos for issuers and payment networks as shown in FIGS. 2 and 3. In some embodiments, 3D image data 826 includes full images of consumer payment cards.

Computing device 810 includes the database 820, as well as data storage devices 830. Computing device 810 also includes an image processing component 840 for creating the model data files of physical payment cards as described above. Computing device 810 also includes a 3D printing component 850 for fabricating physical payment cards using the model data files. A physical configuration component 860 is also included for configuring physical components such as microchips and magnetic strips. Further, computing device 810 includes a user interaction component 870 for interacting with user and/or a consumer during the process of fabrication of physical payment cards. A processing component 880 assists with execution of computer-executable instructions associated with the system.

The embodiments illustrated and described herein as well as embodiments not specifically described herein but within the scope of aspects of the disclosure constitute exemplary means for fabrication of payment cards, and more particularly, constitute exemplary means for the self-issuance of payment cards using 3D printing technologies. For example, the issuer system 110 or the computer device 120 and 3D printer 122 shown in FIG. 1, or any other similar computer device, programmed with computer-executable instructions constitutes exemplary means for the self-issuance of payment cards.

In an alternative embodiment, some or all of the tasks described above as being performed by the issuer, the consumer, and/or a third party. For example, in an alternative embodiment, the issuer creates the model image file, a third party establishes and maintains a kiosk 302 (shown in FIG. 4), and a consumer uses kiosk 302 to create his or her physical payment card.

It should be noted that issuers may prefer to have consumers print their own cards for several reasons. First, it transfers the cost of fabrication to the consumer. Second, it allows the re-issuing of cards on site and on demand. This provides benefits for both the consumer and the issuer. For the consumer, a card can be re-issued at their location and same-day. For issuers, the process can be automated, with a file created and transmitted with less need for human involvement. For example, in some embodiments, discovering that he has lost his card, a consumer may go to a local bank or other kiosk setting and initiate a card re-issue. Once authorized, the image is computer-generated (either locally or remotely) and sent to a local 3D printer for fabrication. Once the 3D printer is complete, other components may be configured and added locally, thus creating a physically complete payment card at the location of the consumer.

In one embodiment, a computer program is provided, and the program is embodied on a computer readable medium and utilizes a Structured Query Language (SQL) with a client user interface front-end for administration and a web interface for standard user input and reports. In an example embodiment, the system is web enabled and is run on a business-entity intranet. In yet another embodiment, the system is fully accessed by individuals having an authorized access outside the firewall of the business-entity through the Internet. In a further example embodiment, the system is being run in a Windows® environment (Windows is a registered trademark of Microsoft Corporation, Redmond, Wash.). The application is flexible and designed to run in various different environments without compromising any major functionality.

The systems and processes are not limited to the specific embodiments described herein. In addition, components of each system and each process can be practiced independent and separate from other components and processes described herein. Each component and process also can be used in combination with other assembly packages and processes.

The term processor, as used herein, may refer to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are exemplary only, and are thus not limiting as to the types of memory usable for storage of a computer program.

As will be appreciated based on the foregoing specification, the above-described embodiments of the disclosure may be implemented using computer programming or engineering techniques including computer software, firmware, hardware or any combination or subset thereof, wherein the technical effect is identifying a consumer account, creating a model data file associated with a payment card, and configuring one or more physical components of the payment card. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" and "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. In other words, the machine-readable medium and the computer-readable medium described herein are non-transitory. The term "machine-readable signal" refers to any signal used to provide machine instructions and/or data to a programmable processor.

The above-described embodiments of methods and systems of self-issuance of payment cards. As a result, the methods and systems described herein facilitate printing payment cards using 3D printer technology and fabrication techniques.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-based method for self-generation of a physical payment card for an identified payment card account, the method implemented using a computer device including at least one processor, said method comprising:
   receiving, by the at least one processor, a request from a user for generating the physical payment card;
   by the at least one processor, identifying and authenticating the user as a cardholder of the identified payment card account based on input received from the user;
   integrating, by the at least one processor, an account number associated with the payment card account into a model data file representing a card body of the physical payment card; and
   transmitting, by the at least one processor, the model data file including the integrated account number to a 3-dimensional printing device, wherein the model data file further includes instructions for fabricating the card body including the integrated account number according to the model data file with the 3-dimensional printer device, and wherein the 3-dimensional printing device fabricates the card body.

2. The method of claim 1 further comprising:
   configuring one or more components for coupling to the fabricated physical payment card, wherein the one or more components include at least one of a magnetic strip and an identification microchip, wherein the model data file further includes instructions for forming a receiving surface on the fabricated physical payment card to assist coupling of the one or more components to the fabricated physical payment card; and
   providing to a third party the one or more components.

3. The method of claim 1, wherein transmitting the model data file to the 3-dimensional printing device further comprises transmitting the model data file to one of the cardholder or a printing service supplier.

4. The method of claim 1, integrating, by the at least one processor, a raised cardholder name associated with the identified payment card account into the model data file.

5. The method of claim 1, wherein the model data file enables one or more of extrusion deposition, granular material binding, and stereolithography in the 3-dimensional printer device.

6. The method of claim 1, wherein creating the model data file comprises:
   integrating, by the at least one processor, a representation of a magnetic portion including a magnetic encoding of the account number into the model data file; and
   including, by the at least one processor in the model data file, instructions for printing the magnetic portion of the physical payment card with the 3-dimensional printer device.

7. The method of claim 1, further comprising integrating, by the at least one processor, instructions for printing a microchip within the physical payment card with the 3-dimensional printer device.

8. A computing device for self-generation of a physical payment card for a cardholder, said computing device comprising a processor communicatively coupled to a memory, said computing device programmed to:
   accept an identified payment card account for a physical payment card to be fabricated;
   integrate an account number associated with the identified payment card account into a model data file representing a card body of the physical payment card; and
   transmit the model data file including the integrated account number to a 3-dimensional printing device, wherein the model data file further includes instructions for fabricating the card body including the integrated account number according to the model data file with the 3-dimensional printer device, and
   wherein the 3-dimensional printing device fabricates the card body.

9. The computing device of claim 8, wherein the computing device is further programmed to transmit the model data file to the 3-dimensional printing device by communicating the model data file to at least one of the cardholder or a printing service supplier.

10. The computing device of claim 8, wherein the computing device is further programmed to:
    configure one or more components for coupling to the fabricated physical payment card, wherein the one or more components include at least one of a magnetic strip and an identification microchip wherein the model data file further includes instructions for forming a receiving surface on the fabricated physical payment card to assist coupling of the one or more components to the physical payment card.

11. A computer-based method for self-generating a physical payment card for a cardholder, the method implemented using a computer device in communication with a user interaction device and a 3-dimensional printer, said method comprising:
    receiving, by the user interaction device from a user via an input device of the user interaction device, a request for generating the physical payment card;
    identifying and authenticating, at the user interaction device, the user as the cardholder based on input received from the user via the input device
    integrating, by the computer device, a payment card account number associated with the cardholder into a model data file representing a card body of the physical payment card;
    receiving, by the 3-dimensional printer, the model data file including the integrated account number, wherein the model data file further includes instructions for printing the card body; and
    printing the card body including the integrated payment card account number by the 3-dimensional printer according to the model data file, thereby generating the physical payment card.

12. The method of claim 11, wherein the method further comprises:
    receiving, by a third party associated with the computer device, one or more components for coupling to the printed card body, wherein the one or more components include at least one of a magnetic strip and an identification microchip for use with the printed payment card, and wherein the model data file further includes instructions for forming a receiving surface on or within the card body to assist coupling of the one or more components to the card body; and
    coupling the one or more components to the card body.

13. The method of claim 11, wherein the model data file further includes component data, wherein the method further comprises printing one or more components on the card body according to the component data, wherein the one or more components include at least one of a magnetic strip and an identification microchip for use with the printed payment card, wherein the component data includes instructions for physically printing the one or more components integrally with the card body.

14. The method of claim 11, wherein printing the card body further comprises printing the card body with the 3-dimensional printer using one or more of extrusion deposition, granular material binding, and stereolithography.

15. The method of claim 11, further comprising integrating into the model data file instructions for printing identifying information for an issuing bank associated with the identified payment card account.

16. A computer system for generating a physical payment card for a cardholder, said computer system comprising:
at least one processor;
a user interaction device communicatively coupled with said at least one processor, said user interaction device comprising a display device and an input device, said user interaction device configured to:
receive a request from a user via said input device for generating the physical payment card; and
identify and authenticate the user as the cardholder with based on input received via said input device from the user, wherein said at least one processor is configured to integrate a payment card account number associated with the cardholder into a model data file representing a card body of the physical payment card; and
a 3-dimensional printer communicatively coupled with said at least one processor, said 3-dimensional printer configured to:
receive, from said at least one processor after authentication of the cardholder, the model data file including the integrated account number, wherein the model data file further includes instructions for printing the physical payment card based on the representation of the card body; and
print the physical payment card using at least the model data file and the 3-dimensional printer.

17. The computer system of claim 16, wherein said 3-dimensional printer is further configured to print one or more components on or within the physical payment card, the one or more components including at least one of a magnetic strip and a microchip.

18. The computer system of claim 16 further comprising a component dispenser in communication with said processor, said component dispenser programmed to configure one or more components to include information associated with the payment card account number.

19. The computer system of claim 18, wherein the one or more components includes one or more of a magnetic strip and a microchip.

20. The computer system of claim 18, wherein said component dispenser is further configured to couple the one or more components to the physical payment card.

21. The computer system of claim 16, wherein said 3-dimensional printer comprises a 3-dimensional printer applying one or more of extrusion deposition, granular material binding, and stereolithography to print the physical payment card.

* * * * *